US006404797B1

United States Patent
Mooradian

(10) Patent No.: US 6,404,797 B1
(45) Date of Patent: Jun. 11, 2002

(54) EFFICIENCY HIGH POWER LASER DEVICE

(75) Inventor: Aram Mooradian, Winchester, MA (US)

(73) Assignee: Novalux, Inc., Sunnyvale, CA (US)

(*) Notice: Subject to any disclaimer, the term of this patent is extended or adjusted under 35 U.S.C. 154(b) by 0 days.

(21) Appl. No.: 09/409,603

(22) Filed: Sep. 30, 1999

Related U.S. Application Data

(63) Continuation-in-part of application No. 08/888,533, filed on Jul. 7, 1997, now Pat. No. 6,243,407.
(60) Provisional application No. 60/041,185, filed on Mar. 21, 1997.

(51) Int. Cl.[7] .................................................. H01S 5/183
(52) U.S. Cl. ........................................ 372/96; 372/38.05
(58) Field of Search ................................. 372/96, 38.05

(56) References Cited

U.S. PATENT DOCUMENTS 5,724,376 A * 3/1998 Kish, Jr. et al. ............... 372/96
5,838,715 A * 11/1998 Corzine et al. ................ 372/96

* cited by examiner

Primary Examiner—James W. Davie
Assistant Examiner—Gioacchino Inzirillo
(74) Attorney, Agent, or Firm—Fulbright & Jaworski LLP

(57) ABSTRACT

In an apparatus and method for generating high power laser radiation, the geometry of the resonant laser cavity defines a fundamental spatial or transverse cavity mode. A gain medium is disposed within the resonant cavity and an energy source energizes the gain medium within a first volume. This causes spontaneous and stimulated energy emission to propagate in the gain medium in a direction transverse to the fundamental cavity mode. The transverse emission in turn optically pumps a second volume of the gain medium about the first volume. When the intensity of the transverse emission is sufficiently high, inversion and gain are produced in the second volume. By optimizing the geometry of the cavity such that the fundamental cavity mode is coupled to both the first and the second volumes encompassing the first pumped volume, the transversely-directed energy of the first volume which would otherwise be wasted is instead captured by the fundamental beam, improving the overall power efficiently of the laser. When configured in an appropriate cavity, the high-power laser of the present invention is especially amenable to frequency conversion of the output beam, as it provides beam intensities suitable for efficient nonlinear frequency conversion.

27 Claims, 9 Drawing Sheets

EFFICIENCY HIGH POWER LASER DEVICE

RELATED APPLICATIONS

This is a Continuation-in-Part application to U.S. patent application Ser. No. 08/888,533 filed on Jul. 7, 1997, U.S. Patent No. 6,243,407 which claims the benefit of U.S. Provisional Application No. 60/041,185, filed on Mar. 21, 1997, and the contents of both applications are incorporated herein by reference. This application is also related to the co-pending application entitled "HIGH POWER LASER" filed together on the same date of this application, the content of the co-pending application is also incorporated herein by reference.

BACKGROUND OF THE INVENTION

Semiconductor lasers in common use today include edge-emitting diode lasers and vertical cavity surface emitting lasers (VCSELs). In an edge-emitting laser, a semiconductor gain medium, for example a quantum-well semiconductor structure, is formed on a surface of a semiconductor substrate. Cavity mirrors are formed or otherwise positioned on opposite sides of the substrate, perpendicular to the substrate surfaces, to form a resonant cavity which includes the gain medium. Electrical or optical pumping of the gain medium generates a laser beam which propagates in a direction along the plane of the substrate.

Edge-emitting lasers are among the most common semiconductor laser devices. Available commercially as individual units and in linear bar arrays, they are used, for example, as an optical pump source for pumping solid state lasers. High power, typically greater than a few hundred milliwatts, adaptations of edge-emitting lasers commonly operate in high order spatial modes and at multiple frequencies. This prevents their use in applications which require high power laser output in a single spatial mode and/or at a single frequency. Edge emitters also have a significant degree of astigmatism and a beam aspect ratio which is generally large, making it difficult to focus the beam to a small spot, which prevents their use in those applications which require a focused output beam. Poor beam quality in edge-emitting lasers also makes frequency doubling of the laser output using nonlinear optical materials difficult and inefficient.

In conventional VCSEL lasers, cavity mirrors are formed or otherwise positioned on opposite faces of a semiconductor gain medium grown on a semiconductor substrate. Electrical or optical pumping generates a laser beam emitted in a direction orthogonal to the plane of the substrate.

Conventional VCSELs find application in optical communications and optical interconnect systems. VCSEL lasers are characterized by generally low fundamental spatial mode $TEM_{00}$ output powers, limited to about 8–10 milliwatts (mW) continuous wave (cw), and are further characterized by small fundamental spatial mode beam diameters, on the order of several micrometers ($\mu$m). Larger area VCSEL emitters, with beam diameters on the order of 100 $\mu$m can produce output beams having a few hundred mW of cw output power. However, operation of conventional VCSELs at high power and large diameter generally carries with it the penalty of an output beam having high-order spatial modes and multiple frequencies. In an external cavity VCSEL configuration, referred to in the art as a vertical external cavity surface emitting laser (VECSEL), an external reflector serves as the output coupler. External cavity VECSEL devices can provide higher fundamental spatial mode output power than VCSEL devices.

Previous work on external cavity vertically emitting semiconductor lasers typically resulted in low output power. The work of Sandusky and Brueck, for example, produced low output power and used optical pumping to excite the semiconductor. See J. V. Sandusky and S. R. J. Brueck, "A cw external cavity surface-emitting laser", *Photonics Technology Letters*, vol. 8 pp. 313–315, 1996. In a study by Hadley et al., an electrically excited VCSEL in an external cavity produced 2.4 mW cw and 100 mW pulsed in a fundamental spatial mode. In this case, an emitting area up to 120 $\mu$m was used. See M. A. Hadley, G. C. Wilson, K. Y. Lau and J. S. Smith, "High single-traverse mode output from external cavity surface emitting laser diodes", *Applied Phys. Letters*, vol. 63, pp. 1607–1609, 1993.

For various laser applications, a beam generated by the laser is subjected to frequency conversion or frequency doubling. This is accomplished by introducing a nonlinear material, for example KTP, KTN, $KNbO_3$, and $LiNbO_3$ into the laser path. The frequency of a beam incident on the non-linear material is converted to a second frequency. The non-linear materials are referred to as "doubling crystals" where the property of the material is such that it serves to double the frequency of a beam traversing the crystal. Efficient frequency conversion by the material generally requires a high-intensity, single mode incident beam.

Frequency doubling of semiconductor lasers has been demonstrated in the past to varying degrees of success using a doubling crystal mounted external to an edge-emitting diode laser cavity. The output beams from edge-emitting diode lasers are usually highly divergent and have significant aspect ratios as well as some degree of astigmatism which degrades the optical field intensity and phase front from that which is ideally required for efficient frequency doubling. Experiments have been carried out in which the light from a diode laser is launched into an optical waveguide fabricated in a non-linear material in order to maintain the optical field intensity over some relatively long path length. This technique is generally complicated and uses relatively low power diode lasers which have sufficient beam quality to launch the laser light into the external waveguide.

Various techniques in the past have attempted to harness beam power to enable efficient conversion. A first technique by Gunter, P. Gunter et al. "Nonlinear optical crystals for optical frequency doubling with laser diodes", Proc. of *SPIE*, vol. 236, pages 8–18, 1980, demonstrated low efficiency frequency doubling of diode laser radiation using potassium niobate $KNbO_3$ in a single-pass doubling configuration. In another technique, Koslovsky et al., Optics Letters 12, 1014, 1987, employed a single spatial mode, edge-emitting diode laser and $KNbO_3$ in an external ring resonator to increase the circulating power to achieve frequency conversion. The Koslovsky configuration required frequency-locking of the single-frequency laser to the Fabry-Perot resonance of the ring cavity as well as matching the temperature of the non-linear crystal to both frequencies. This requires complicated crystal alignment and wavelength control circuitry to maintain frequency locking.

SUMMARY OF THE INVENTION

The present invention is directed to an apparatus and method for generating high power laser radiation in a single fundamental spatial mode, in a manner which overcomes the aforementioned limitations. The laser of the present invention, when configured in an external cavity, is especially amenable to frequency conversion of the output beam, as it provides beam power densities over suitable path lengths for efficient frequency conversion.

In a first embodiment of the present invention, the apparatus comprises a resonant cavity defined between first and second partial reflectors. The geometry of the resonant cavity defines a fundamental spatial or transverse cavity mode. A gain medium is disposed within the resonant cavity, and a first volume of the gain medium is adapted to be energized by an external energy source. This causes spontaneous and stimulated energy emission to propagate in the gain medium in a direction transverse to the fundamental cavity mode. The transverse emission, in turn, optically pumps a second volume of the gain medium about the first volume. When the intensity of the spontaneous emission is sufficiently high, inversion and gain are produced in the second volume. The energy within the first and second volumes is coupled into the fundamental cavity mode laser beam.

By optimizing the geometry of the cavity such that the fundamental cavity mode is coupled to both the first and second volumes, the energy of the first volume transversely-directed into the second volume, which would otherwise be wasted, is instead captured by the fundamental beam, improving the overall power efficiency of the laser. To effect this, in a preferred embodiment, the cavity mirrors are selected to match the fundamental cavity mode to the cross-sectional diameter of the second volume. In this manner, the laser energy in the fundamental spatial mode is efficiently extracted from both first and second volumes of the gain medium. Similar results apply where the output energy is in a higher order spatial mode.

In a preferred embodiment, the first volume is substantially cylindrical and of cross sectional diameter $D_1$, and the second volume is substantially an annulus of outer cross-sectional diameter $D_2$ and inner cross-sectional diameter $D_1$, the first and second volumes being substantially cross-sectionally concentric.

The gain medium is preferably formed of a semiconductor material in a vertical cavity configuration. Alternatively, the gain medium may be formed of a solid state material having an active ion which has absorption in the spectral region of the gain transition. Examples of such solid state materials include Er:glass, Yb:glass, and Yb:YAG. In the case of solid state materials, pump energy would be preferably generated by optical means, for example a diode laser. In the preferred embodiment, the gain medium is formed on a semiconductor substrate at a first side and the first reflector is formed directly adjacent to the gain medium. The second reflector is positioned at a second side of the semiconductor substrate, opposite to the first. The second reflector may be monolithically grown on the semiconductor substrate, or it may be bonded to the semiconductor substrate by various techniques.

A nonlinear crystal may be placed in the optical cavity or external to the laser to change the laser output frequency. Suitable materials for nonlinear conversion include KTP, KTN, $KNbO_3$, and $LiNbO_3$ and periodically-poled materials such as periodically-poled $LiNbO_3$.

A preferred embodiment of the present invention, described in detail below, is capable of generating intracavity circulating power levels in excess of 10 kW in a fundamental spatial mode for a 1 mm diameter beam. These levels are sufficient for producing harmonic conversion of the fundamental radiation in a non-linear material. As an example, frequency doubling in a semiconductor configuration using GaInAs gain media provides a fundamental wavelength of 900 nm to 1100 nm and a frequency doubled output in the blue to green wavelengths.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
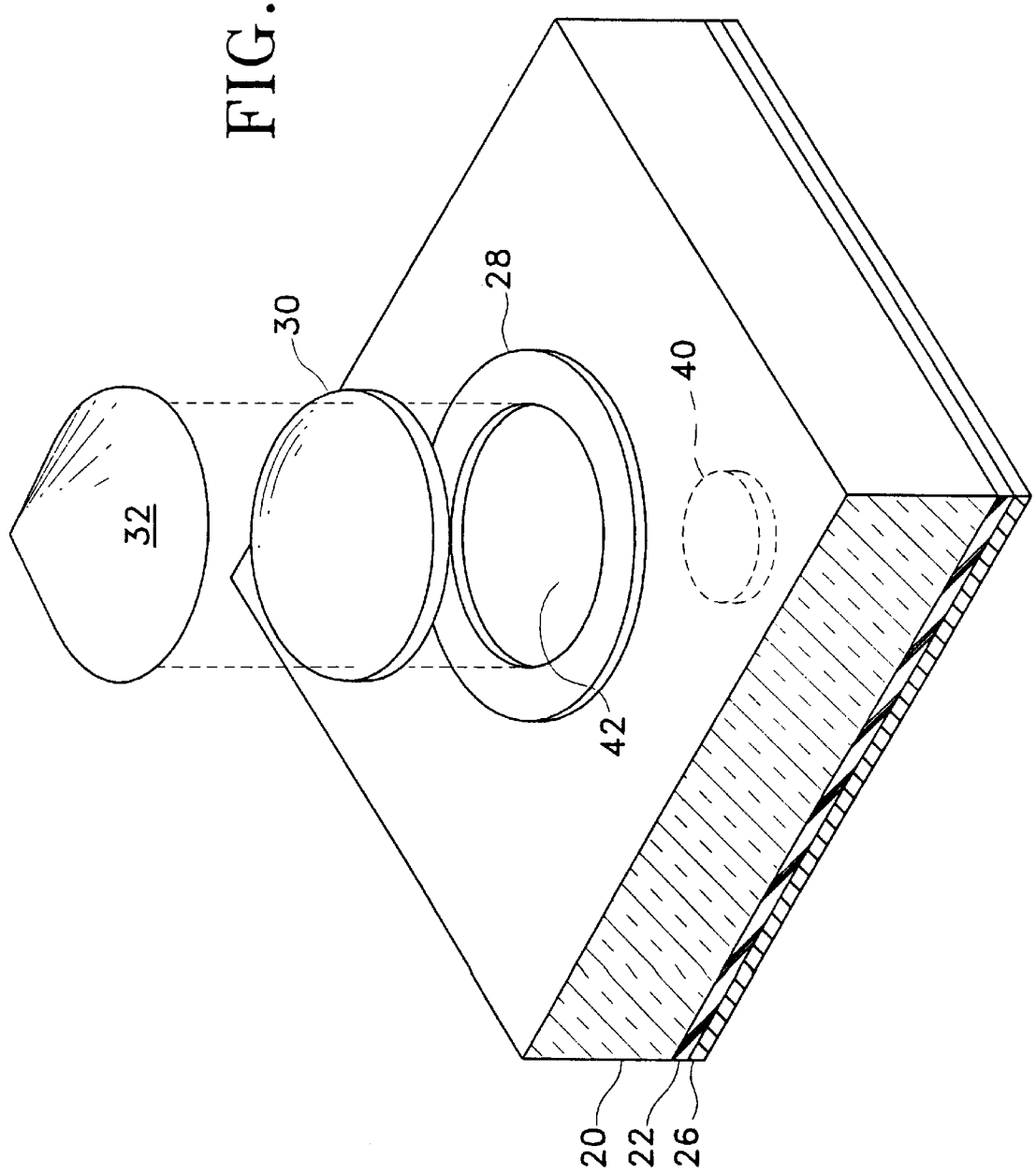
FIG. 1 is a perspective and exploded view of a VECSEL laser configuration in accordance with the present invention.

FIG. 1 is a perspective and exploded view of a preferred embodiment of the present invention, in a VECSEL configuration. The laser of FIG. 1 includes a semiconductor substrate 20, upon a first face of which is formed a semiconductor quantum-well gain region 22. A first reflector 26, for example a p-type Bragg reflector, is formed on the quantum-well region 22. A second reflector 30 is positioned opposite the first reflector 26. The distance between the first and second reflectors 26, 30 and their respective curvatures define a fundamental cavity mode 60. The second reflector 30 is illustrated as one embodiment of the present having an external cavity mirror in FIG. 1 in accordance with a VECSEL configuration. However, in a preferred embodiment of the present invention, the second reflector 30 is layered directly adjacent to the second face of the substrate to provide a VCSEL configuration. Note that for purposes of the present invention, the term "reflector" as used herein includes partially and/or fully reflective materials and/or surfaces. A surface 42 of the substrate 20 facing the second reflector 30 preferably is treated with an anti-reflection coating 42, such that any beam energy 60 traversing that interface will pass with minimal reflection, a desirable feature as is well known in the prior art.

Figure 2A:
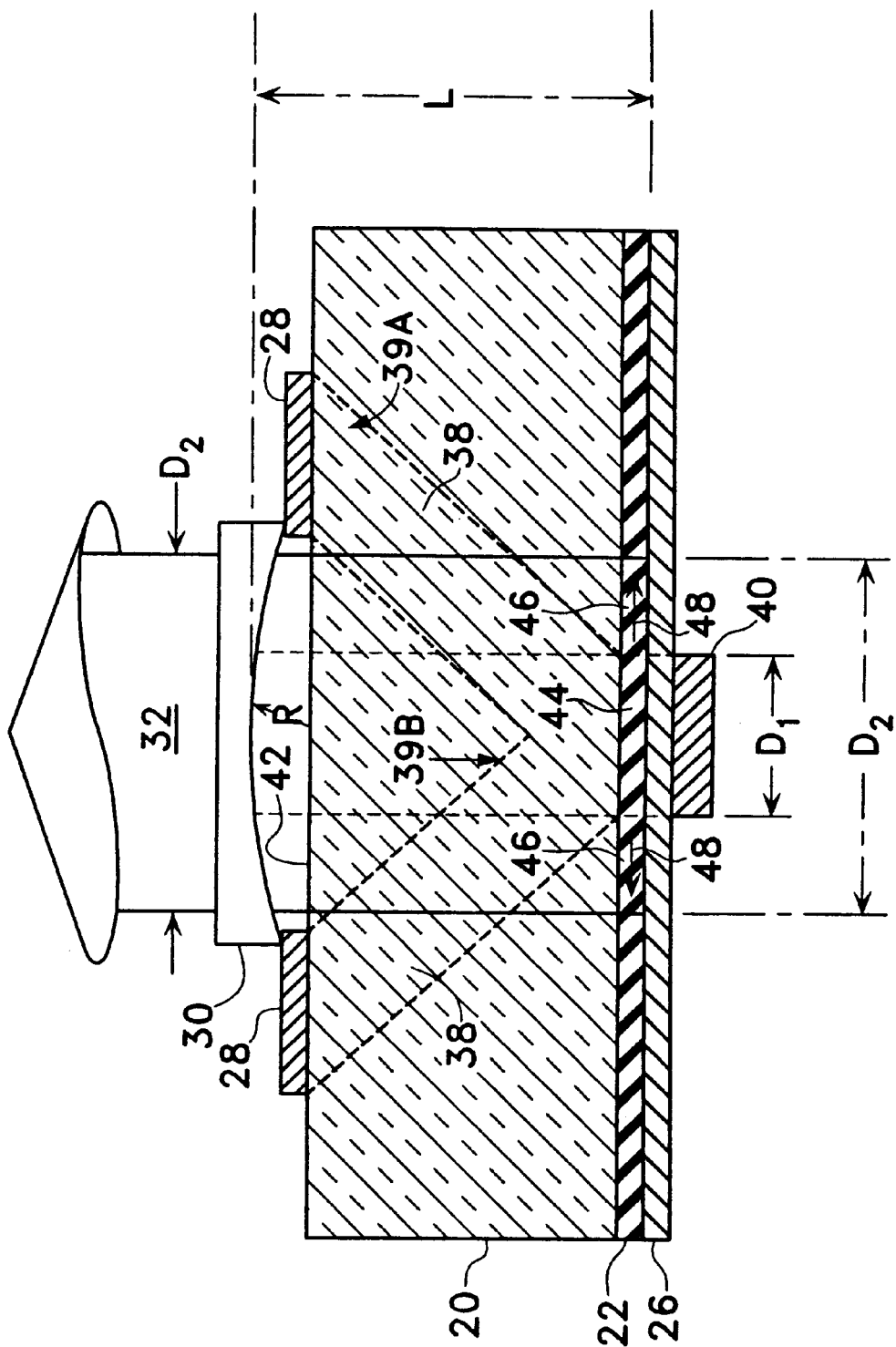
FIG. 2(a) is a cutaway side view of the configuration of FIG. 1 illustrating transverse propagation of spontaneous and stimulated emission from the first pumped volume into the second annular volume in accordance with the present invention.

As shown in the cross-sectional illustration of FIG. 2(a), the resonant cavity is pumped electrically through an annular electrical contact 28, causing current 38 to flow between the annular contact 28 and a circular contact 40 on opposite faces of the substrate 20. The resulting current flow 38 is generally conical in shape, the base 39A of the cone being at the annular contact 28 and the peak of the cone 39B being near contact 40. The flow in the peak 39B is generally circular in cross section and energizes a substantially cylindrical first volume 44 of the gain region 22, the first volume 44 being of a cross-sectional diameter $D_1$. The diameter $D_1$ is preferably substantially greater than the thickness of the gain region 22.

The excited gain region 22 of diameter $D_1$ generates stimulated and spontaneous optical emission, represented by arrows 48, which travels in a direction transverse to the propagation of the cavity laser beam. In standard prior-art VCSEL or VECSEL lasers, such optical energy would escape out the sides of the device or would otherwise be wasted as energy not contributing to the output beam 32. In the configuration of the present invention, this transverse energy 48 is absorbed in an annular second volume 46 surrounding the first pumped volume. This absorbed energy serves to pump the second volume 46, providing gain and therefore power into the fundamental laser mode 60.

When the electrical or optical pumping of the first volume 44 produces gain, this gain occurs for both the transverse and longitudinal directions. Since the traverse gain length is larger than the longitudinal gain length, more stimulated emission can occur in that direction. The larger the dimension $D_1$, the greater the net gain for stimulated emission in the transverse direction. Higher output power requires larger area devices because of thermal dissipation and the limit set by catastrophic degradation by the optical power density on the surface of the semiconductor in the longitudinal direction. For such large area devices, significant power can be lost by the occurrence of the transverse stimulated emission thereby reducing the overall power conversion efficiency. Spontaneous emission also occurs but becomes less important for the larger area devices. If the adjacent region is designed to absorb the stimulated emission (and also to a lesser extent the spontaneous emission), then the energy that otherwise would have been lost can be used to optically pump the second volume 46 to the extent that it will produce gain. The energy pumped into the second volume 46 can be extracted in the orthogonal direction by adjusting the external mirror 30 to produce a mode waist equal to $D_2$ on the gain medium. The external cavity mirror 30 will fix or "clamp" the gain in the total area defined by $D_1$, and $D_2$. There is a limit to the extent of the second volume 46, as the degree of transverse pumping decreases with decreasing intensity away from the center of the pumped region. This limit is related to the dimension $D_1$ and the pumping intensity (electrical or optical) in the area defined by $D_1$.

Given the mode waist diameter $D_2$, the technique for designing a cavity which would provide a suitable radius of curvature R for the second reflector 30 and the suitable optical cavity length L is well known in the art. See, for example, Herwig Kogelnik and Tingye Lee, "Beams, Modes, and Resonators", CRC Handbook of Lasers, CRC Press, 1971, pg. 421–441. The second diameter $D_2$ is a function of the excitation level and the diameter $D_1$. The design would be optimized for maximum output power limited by the circulating power density, which is limited by catastrophic degradation of the semiconductor, and the thermal power dissipation from the second diameter $D_2$. The mode waist diameter for the cavity could be matched, for example, by adjusting the cavity length L for a fixed radius of curvature R for the second reflector 30.

Figure 6:
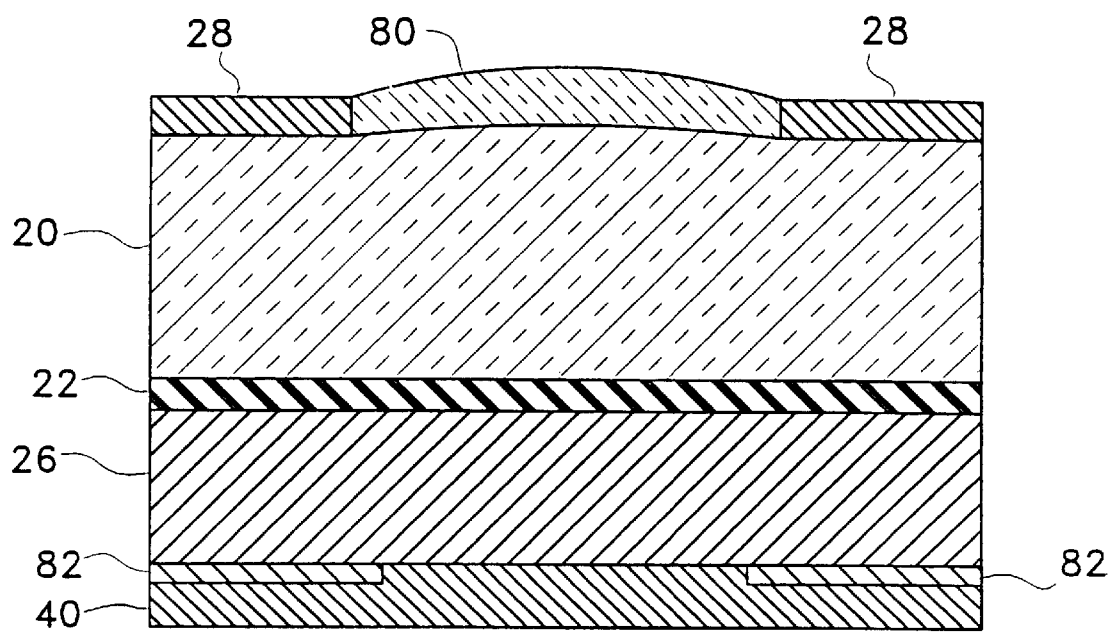
FIG. 6 is a side view of a VCSEL laser configuration having a second reflector/lens positioned directly adjacent to the semiconductor substrate.

In FIG. 2(a), the second reflector 30 is positioned directly adjacent to the annular contact 28. As a result, a space is formed between the surface 42 of the semiconductor substrate 20 and the second reflector 30. This arrangement may be accomplished by bonding the second reflector 30 to the annular contact 28, or by any other suitable techniques that are known to persons in the art. Alternatively, the second reflector may be positioned directly adjacent to the surface 42 of the semiconductor substrate 20 and leaving no space therein between, as shown in FIG. 6, which will be explained in more detail.

Figure 2B:
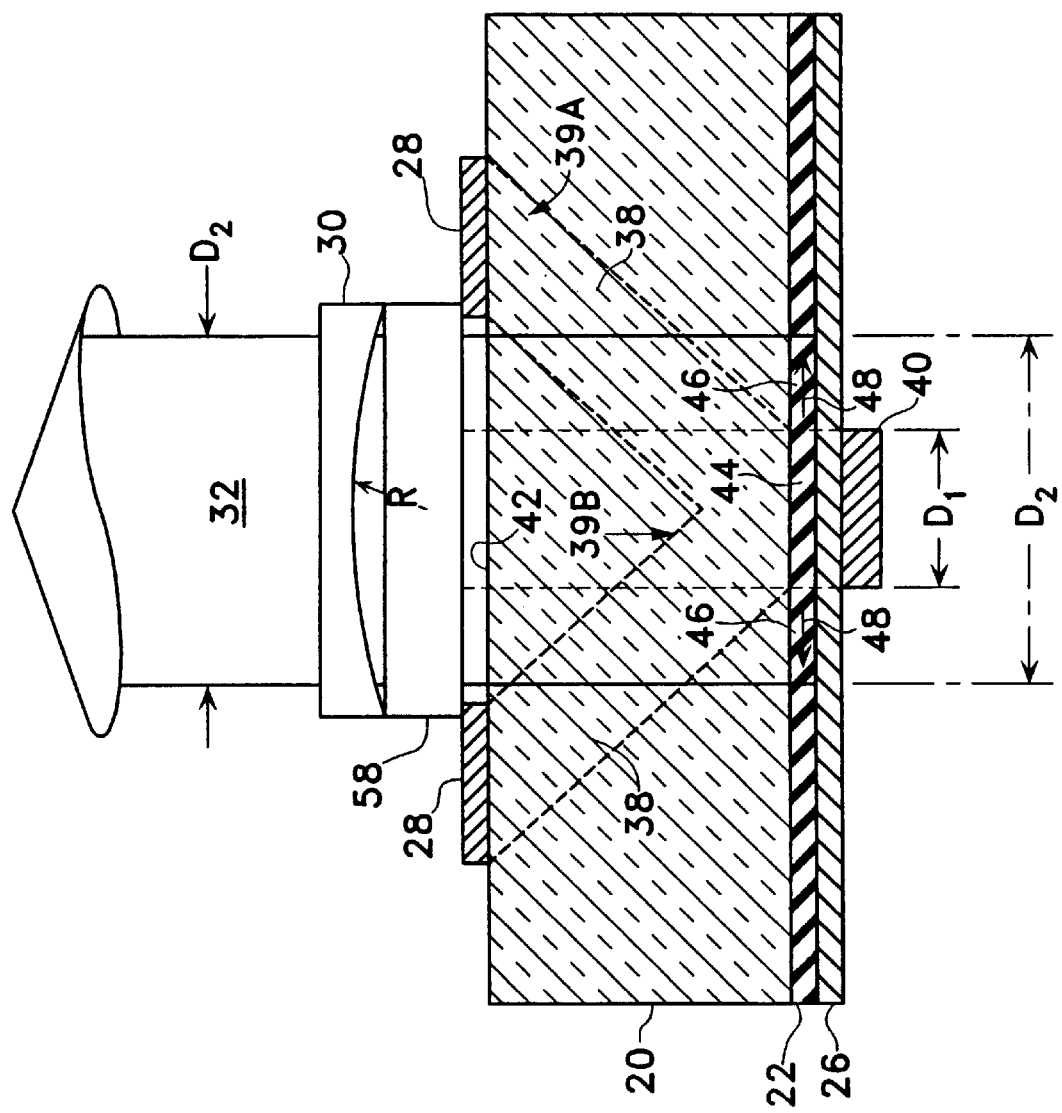
FIG. 2(b) is a cutaway side view of the configuration of FIG. 1 illustrating an nonlinear material being added to the present invention.
Figure 2C:
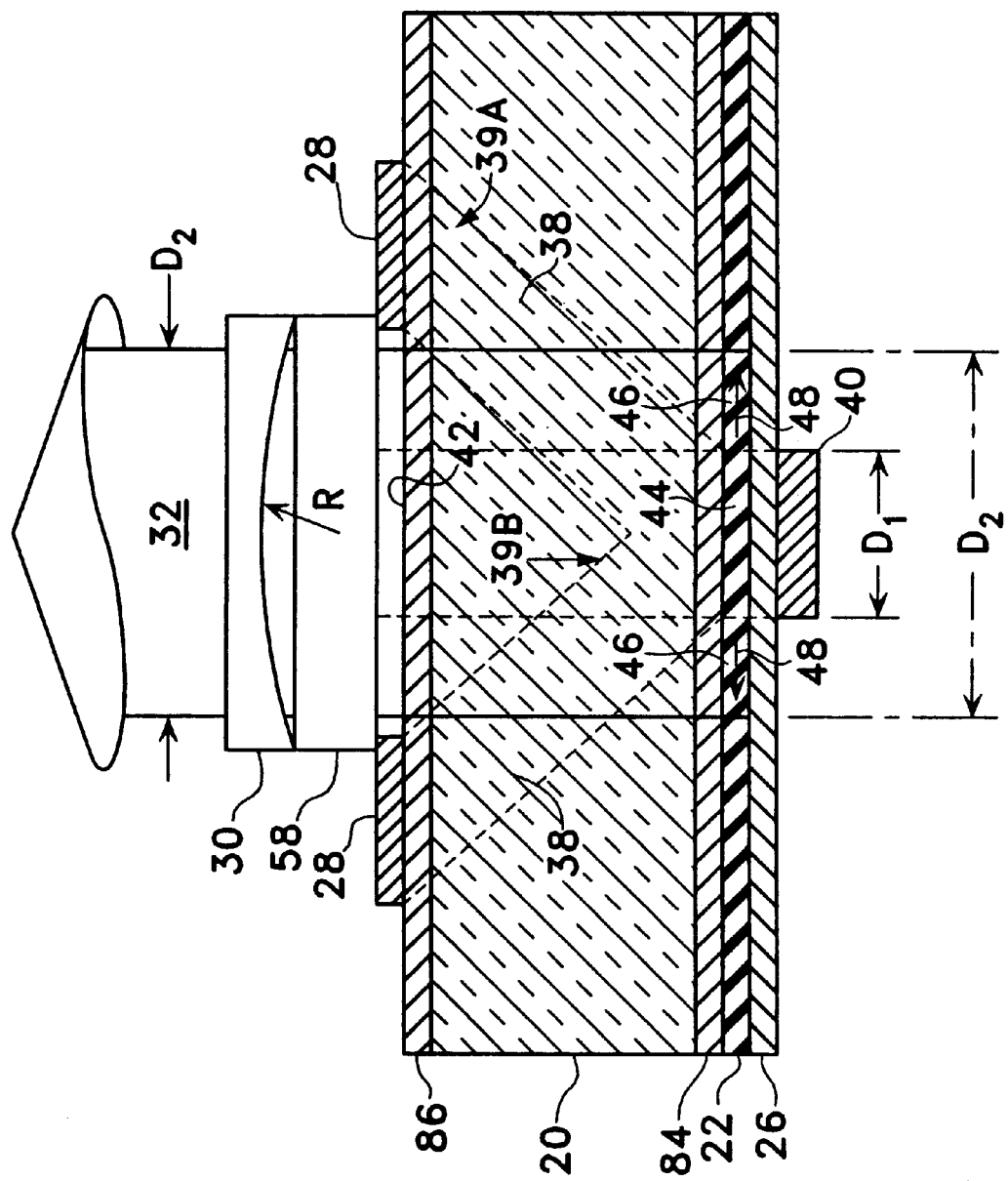
FIG. 2(c) is a cutaway side view of the configuration of FIG. 1 illustrating a resistance-spreading layer and a saturable absorber layer being added to the present invention.

FIG. 2(c) shows an alternative embodiment of the present invention having a resistance-spreading layer 86 positioned adjacent to the top surface of the semiconductor substrate 20, and a saturable absorber layer 84 positioned between the semiconductor substrate 20 and the quantum-well region 22.

Figure 3:
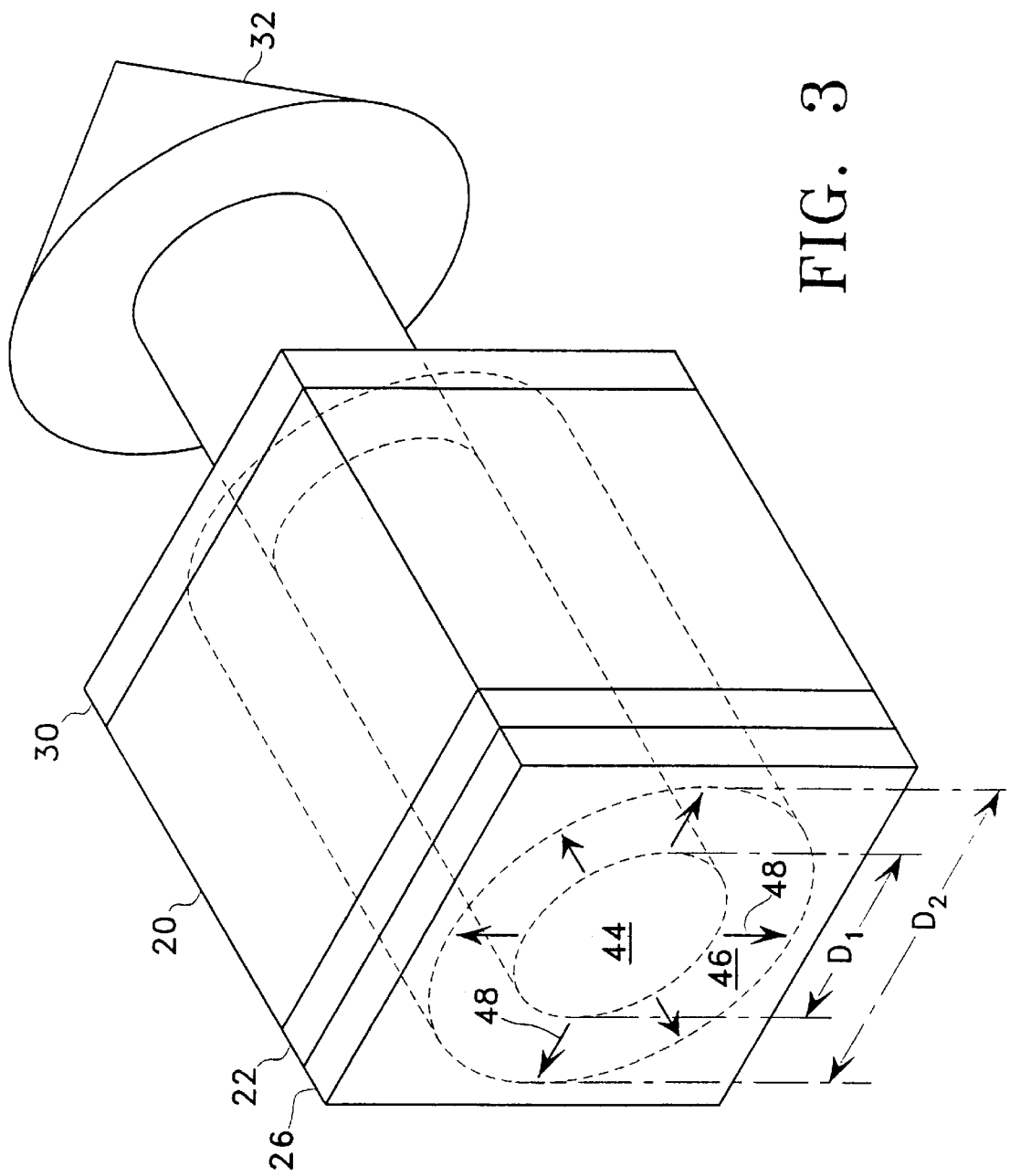
FIG. 3 is a perspective view of a VCSEL laser configuration illustrating the relationship of the first pumped volume and the second annular volume in accordance with the present invention.

FIG. 3 is a perspective view of a laser in a VCSEL configuration in accordance with the present invention illustrating the relationship of the first pumped volume 44 and the second output volume 46. The pumped first volume 44 is of diameter $D_1$ in the region of the gain medium 22. The transverse propagation of spontaneous and stimulated emission represented by arrows 48 optically pumps or otherwise energizes an annular volume 46 surrounding the first volume 44. The annular volume 46 has an inner diameter of $D_1$, and an outer diameter of $D_2$ and is substantially cross-sectionally concentric with the first volume 44 assuming a Gaussian beam distribution. The fundamental cavity mode is optimized to have a diameter approximately equal to the outer diameter $D_2$ of the second volume 46, such that energy in both first and second volumes is captured and therefore contributes to the output beam 32. Excitation of the first volume 44, may occur by electrical or optical means.

The laser cavity parameters are preferably adjusted to set the mode waist substantially equal to the diameter $D_2$ at the maximum operating power levels. In a laser cavity comprising a single flat mirror 26 and a single concave spherical mirror 30 having a radius of curvature R as shown in FIG. 2, the mode beam diameter on the laser chip $w_1$ and at the output mirror $w_2$ is characterized by:

$$W_1^2 = 4\lambda L/\pi[(R-L)/L]^{1/2} \quad (1)$$

$$W_2^2 = 4\lambda R/\pi[(L/(R-L)]^{1/2} \quad (2)$$

where L is the cavity length and $\lambda$ is the wavelength of the output laser beam 32 as described in Kogelnik et al. cited above. It is clear from these equations that the diameter of the fundamental laser mode can be made equal to the outer diameter $D_2$ of the second volume 46, for example by adjusting the cavity length L for a specific radius of curvature R. Alternatively, the radius of curvature R may be selected for a specific range of cavity lengths L. Instead of curved mirrors, a flat output coupler 30 may be employed with a lens in the cavity, of appropriate geometry to achieve the same results. A physical lens or thermal lens may be used for this purpose.

A preferred embodiment of a semiconductor laser device may comprise a multiple element quantum well structure or a single gain region having a total gain thickness equivalent to that of a multiple quantum well structure. In order to achieve a sufficient gain necessary to overcome the optical loss in the laser structure within the cavity, at least several quantum wells would be required to a laser device. For more efficient operation, at least ten quantum wells are used in order to effectively overcome the optical losses due to optical absorption at the laser wavelength in the conductive substrate layer 20. A typical thickness for a single quantum well is approximately 8–10 nm. Typically, a laser structure such as a GaInAs gain region 22 having more than 3 quantum wells requires strain compensation in the gain region 22, which may be accomplished by adding GaAsP layers to the gain region 22, as is well known in the art. The total thickness or the number of quantum wells can be increased to increase the gain to overcome all intracavity losses for efficient operation. This is limited only by the ability to uniformly grow such structures and by the practical threshold current density for such structures. Conventional VCSELs typically operate with only one or a few quantum wells between very high reflectivity mirrors. Such devices exhibit low optical gain and therefore would not operate as efficiently as the apparatus of the present invention.

The electrical current or optical pump energy injected into the laser device can be provided by any of the well-known methods, for example in G.P. Agarwal, "Semiconductor Lasers", The American Institute of Physics Press, pages 146–157. In a preferred embodiment of the present invention, most of the injection current 38 is directed into a circular region of a diameter equal to or less than the diameter $D_1$ of the fundamental spatial mode as defined by equations (1) and (2) above.

As described above, low efficiency frequency doubling of diode laser radiation using edge-emitting diode lasers has been demonstrated in the past by Gunter and Koslovsky et al. In contrast, the preferred embodiment of the present invention employs a VCSEL or VECSEL vertical cavity laser structure in which the total single pass gain is significantly lower than in edge-emitting lasers. In addition, the output from the vertical cavity device of the present invention is distributed over a much larger circular beam area than in edge-emitting devices, for example several hundred times greater in area. The achievable intracavity circulating power density in a fundamental circular spatial mode can exceed several MW/cm$^2$, limited only by catastrophic degradation at the semiconductor surface. While similar power densities can be achieved in edge-emitting lasers, the beam is confined to the waveguide of the diode cavity which makes frequency doubling difficult. Since the efficiency of frequency conversion is dependent on both the optical intensity and the length of the interaction region, frequency doubling of diode lasers is complicated and has been carried out in waveguide structures to maintain the field intensity of a sufficient long interaction length because the beam is substantially non-divergent within the optical laser cavity. A high beam provides a more favorable frequency conversion situation for any conversion configuration outside of the cavity such as in the recently-studied periodically-poled nonlinear materials. Furthermore, the present invention can be operated in a pulsed, gain-switched, or mode-locked configuration to increase the optical power and therefore the nonlinear conversion efficiency. The present invention applies not only to harmonic frequency conversion, but also to sum and difference frequency generation. In a preferred embodiment, the non-linear material includes Fabry-Perot resonances such that the laser operates in a single frequency. An exemplary configuration is illustrated in FIG. 2(b), which includes an intracavity non-linear crystal 58 between the substrate 20 and external mirror 30.

Each prior art configuration mentioned above, for example the Sandusky et al. and Hadley et al. configuration, was limited by matching the cavity geometry to the extent of the pumped volume only, unlike the present invention which extracts energy from the first pumped volume in addition to the second volume energized by transverse energy emission generated in the first volume.

The output power in the present invention can be magnified by increasing the diameter of the mode volume, as described above. Peak output power levels, for example in excess of 10 kW, can be generated from a gain area of one millimeter in diameter. Continuous cw output power levels may exceed 10 Watts from a single element device, limited only by thermal considerations.

A second harmonic radiation which propagates in the backward direction can additionally be absorbed in a semi-conductor laser structure in such a way as to produce electrons and holes which migrate to the active gain region, thereby increasing the power of the fundamental laser radiation. This also has the effect of increasing efficiency of the second harmonic output as well as producing a single-ended output of harmonic radiation. However, the materials between the frequency doubling materials, such as a non-linear crystal, and the gain region 22 must be transparent to the second harmonic radiation. In an alternative embodiment, a three-mirror cavity could be used in which the nonlinear material is disposed in a position in which the harmonic radiation does not reflect back into the gain medium but exits through the middle mirror. A ring resonator configuration may also be employed.

Typical frequency doubling materials appropriate for conversion of infrared wavelengths into the visible include periodically-poled LiNbO$_3$, KTP, and KNbO$_3$. For example KTP can be phase matched to convert 1 $\mu$m radiation into green wavelengths and KNbO$_3$ can convert infrared radiation into blue wavelengths using GaInAs diode lasers operating in the 900 nm wavelength range.

Many configurations for intracavity frequency doubling that are well known in the field can be used in the present invention. For example, a focusing lens can be positioned within the laser resonator defined by the mirrors 26 and 30 to increase the power density. The technique would allow use of very short lengths of nonlinear materials or nonlinear materials with lower nonlinear figures-of-merit.

For doubling materials such as KTP and KNbO$_3$, active crystal lengths can be significantly less than 1 cm for the circulating power levels possible in the present configurations. Shorter nonlinear material lengths provide wider temperature and wavelength phase matching conditions. For KNbO$_3$ for example, a crystal length of 1 mm or less can provide a temperature phase matching bandwidth of more than several degrees Celsius and a wavelength bandwidth of several nanometers. Such broad acceptance ranges make the manufacture and operation of such devices significantly more practical. The wavelength may be controlled by the selection of the alloy composition of the gain medium material, while precision wavelength control is achievable with intracavity etalons or other wavelength controlling techniques well known in the art. Similar results apply to other nonlinear materials, including KTP.

In the preferred embodiment, the non-linear material 58 is positioned directly adjacent to the annular contact 28 and the second reflector 30 is then placed directly adjacent to the non-linear material 58, as shown in FIG. 2(b). Similar to the second reflector 30 shown in FIG. 2(a), the non-linear material 58 in FIG. 2(b) may be bonded to the annular contact 28, or it may be coupled to the annular contact 28 by various techniques known in the art. Likewise, the second reflector 30 may be bonded to the nonlinear material 58, or it may be coupled to the nonlinear material 58 by various technique known in the art. In an alternative embodiment of the present invention, the nonlinear material 58 may be placed directly adjacent to the surface 42 of the semiconductor substrate 20 and the second reflector 30 is placed directly adjacent to the nonlinear material 58.

The semiconductor gain region 22 preferably comprises a multiple-element quantum well structure. Alternatively, a single gain region whose total gain thickness is equal to that of the multiple quantum well structure may be employed. As mentioned, in order to achieve sufficient gain, there has to be several quantum wells in the laser structure made from GaInAs. For a high-peak-power device operating under pulsed conditions using either electrical or optical excitation, the number of wells could be more than 50. The limit is governed by the practical ability to grow large numbers of strain-free quantum well layers and strain compensating layers of GaAsP. In this case, a heterostructure may be a more effective choice. High-peak-power devices could be made, for example, by using high-power Q-switched solid state lasers as pump sources.

Conventional vertical cavity semiconductor lasers typically operate with only one or a few quantum wells and very high reflectivity cavity mirrors. Such devices may not operate as efficiently in the present invention because of inherently low optical gain. The net gain must be sufficient to overcome losses in the cavity including the optical absorption losses in the substrate material 20 and the optical losses in the nonlinear material and associated anti-reflection coating on the intracavity optical elements.

FIG. 2(a) illustrates a typical quantum-well device 22 formed on a semiconductor substrate 20. A highly reflective mirror 26 is grown on the back surface of the device to provide one of the mirrors of the laser resonator. The top cladding layer serves as a conductive contact which can be antireflection coated 42 and which has low optical absorption at the laser wavelength. In an alternative embodiment, a layer of electrically-conductive material with an optical bandgap greater than the second harmonic radiation serves as the conductive layer with a second layer, of thickness less than the diffusion length of carriers and transparent to the fundamental laser radiation, and absorbing the second harmonic radiation grown between the active material and the thick wide-bandgap material, would allow the optically excited carriers to diffuse into the gain region. The thick conductive material may comprise for example, deposited tin oxide.

Single frequency operation may be achieved, for example, by introducing an etalon in the cavity. Alternatively, the nonlinear crystal 58 may also serve as a frequency selective element.

The ability to generate visible wavelengths in high-power output makes the present invention attractive to a range of applications including projection display, optical disc read and write, optical holographic memory storage, and bio-fluorescence sensors. For the case of projection display, three primary colors could be generated. For example, the blue wavelength and green wavelength could be produced by frequency doubling the output of GaInAs semiconductor lasers whose outputs could be selected in the wavelength range from 900 nm to more than 1100 nm. Appropriate frequency doubling materials include KTP for the green wavelength and $KNbO_3$ for the blue wavelength. Power may be scaled using arrays of such devices. Output power levels of several tens of Watts may be generated. Since the output from such an array would lack coherence between elements of the array, the effects of speckle would be significantly reduced so as not to affect the quality of the projected image in the display system. In the case of an array device, the output couplers may comprise an array of lithographically-produced binary optical mirrors or micromirrors whose positions are precisely aligned with the center of the diode laser emitting areas, as shown in FIG. 7.

A projection display system employing the present invention could be operated using various light valve devices such as liquid crystal spatial light modulators, micro-mirrors such as those sold by Texas Instruments, and grating deflector light valves such as those developed by Silicon Light Machines of Sunnyvale, Calif. For an array of laser sources, all elements of the light valve could be illuminated by every laser source by allowing the individual laser beams to expand so they overlap in the far field. In this way, the failure of one element would not significantly degrade the operation of the system. Binary optical lenses may be used to focus the laser light in a top-hat distribution onto each pixel of the light valve to make efficient use of all available laser radiation.

Figure 7:
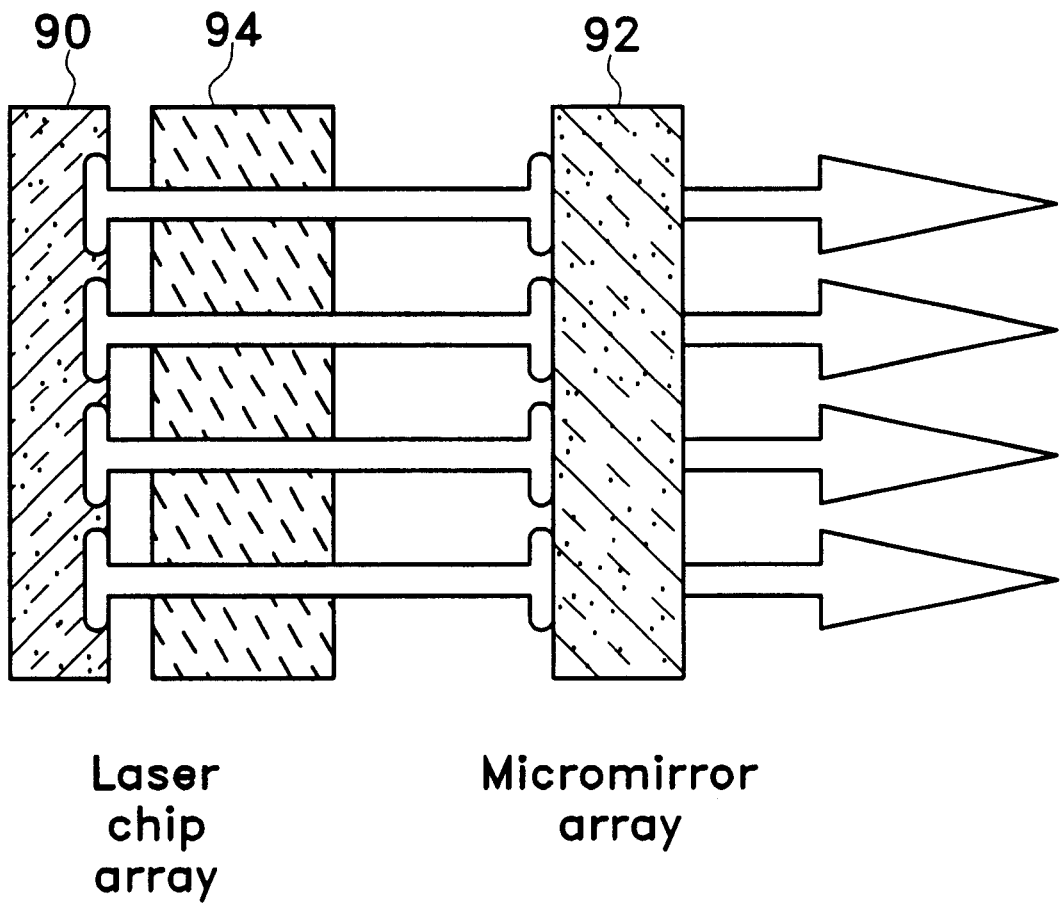
FIG. 7 is a cutaway side view of an array of VCSEL lasers formed on two semiconductor substrates.

FIG. 7 shows an exploded cross-sectional side view of an embodiment of the array arrangement of the laser devices according to the present invention. An one or two-dimensional array of surface emitting laser devices are formed in a first semiconductor substrate 90, and a corresponding one or two-dimensional array of micro-reflectors are formed on a second semiconductor substrate 92. The first and second semiconductor substrates 90, 92 are then coupled together by various techniques well known in the art, forming an one or two-dimensional array of VCSEL or VECSEL laser devices. Positions of the surface emitting laser devices and the micro-reflectors on respective semiconductor substrates 90, 92 are precisely defined so that each surface emitting laser device may be accurately coupled to a corresponding micro-reflector respectively when both substrates are coupled together. In addition, an optional non-linear material 94 may be positioned between the first and second substrate 90, 92 for frequency selection.

While this invention has been particularly shown and described with references to preferred embodiments thereof, it will be understood by those skilled in the art that various changes in form and details may be made therein without departing from the spirit and scope of the invention as defined by the appended claims.

Figure 4:
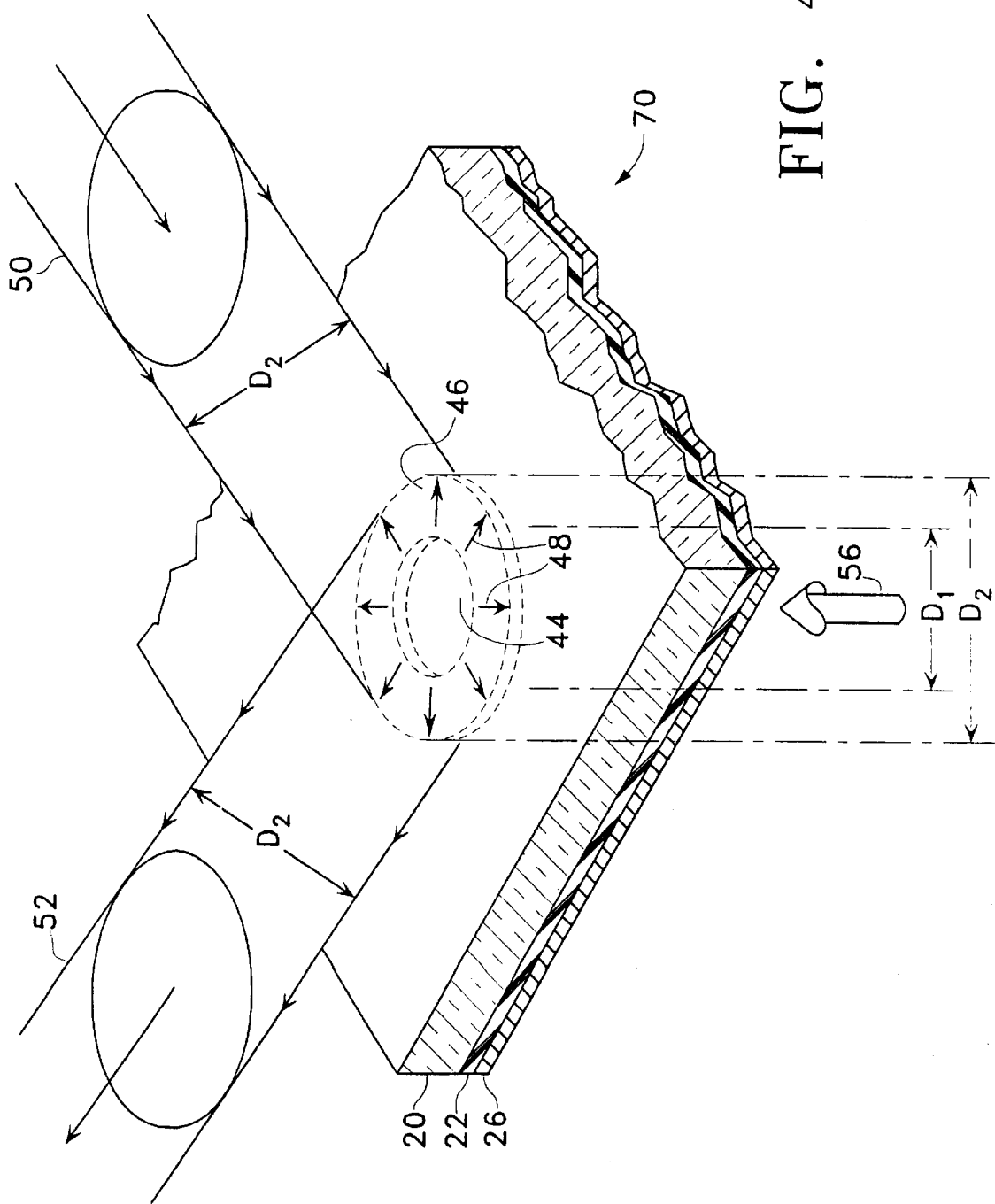
FIG. 4 is a perspective illustration of an optical amplifier configuration in accordance with the present invention.

As an example of an alternative embodiment, FIG. 4 is a perspective illustration of the present invention configured as an optical amplifier 70. As in the laser configuration, the optical amplifier 70 configuration includes a semiconductor substrate 20, a semiconductor gain medium 22, and a first reflector 26. Note that a second reflector is not required as the optical amplifier 70 does not include a resonant cavity. A first volume 44 of the gain medium 22 is pumped with electrical or optical energy 56. The first volume 44 is generally cross-sectionally circular, having a diameter $D_1$. As described above, this causes transverse stimulated and spontaneous propagation of energy 48 into a second volume 46 about the first volume 44. In a preferred embodiment, the second volume 46 is substantially circular in cross-section, the diameter being $D_2$. An incident beam 50 of diameter $D_2$ and of a first amplitude is directed at the pumped region 46, overlapping with and being energized by both the first volume 44 and second volume 46. The incident beam 50 reflects at mirror 26 and is released as an output beam 52 of similar diameter $D_2$. The output beam 52 is amplified by the energized gain region 46 and is therefore of higher intensity than the incident beam 50. A plurality of such gain elements may be used to increase the total gain of the system. For example, a plurality of such gain elements can be arranged in series to each other. In addition, a plurality of mirrors are arranged in series and are properly positioned to reflect the output beam 52 back to the next gain element. As a result, the incident beam 50 is amplified by each gain element to increase the total gain. Likewise, the above-mentioned configuration may apply to a plurality of VECSEL laser devices arranged in series to increase the total output power. Alternatively, each of the serially arranged VECSEL devices may have a single-quantum-well structure, and thus lower gain, while the overall output power of the above arrangement could still reach to a desirable level.

Figure 5:
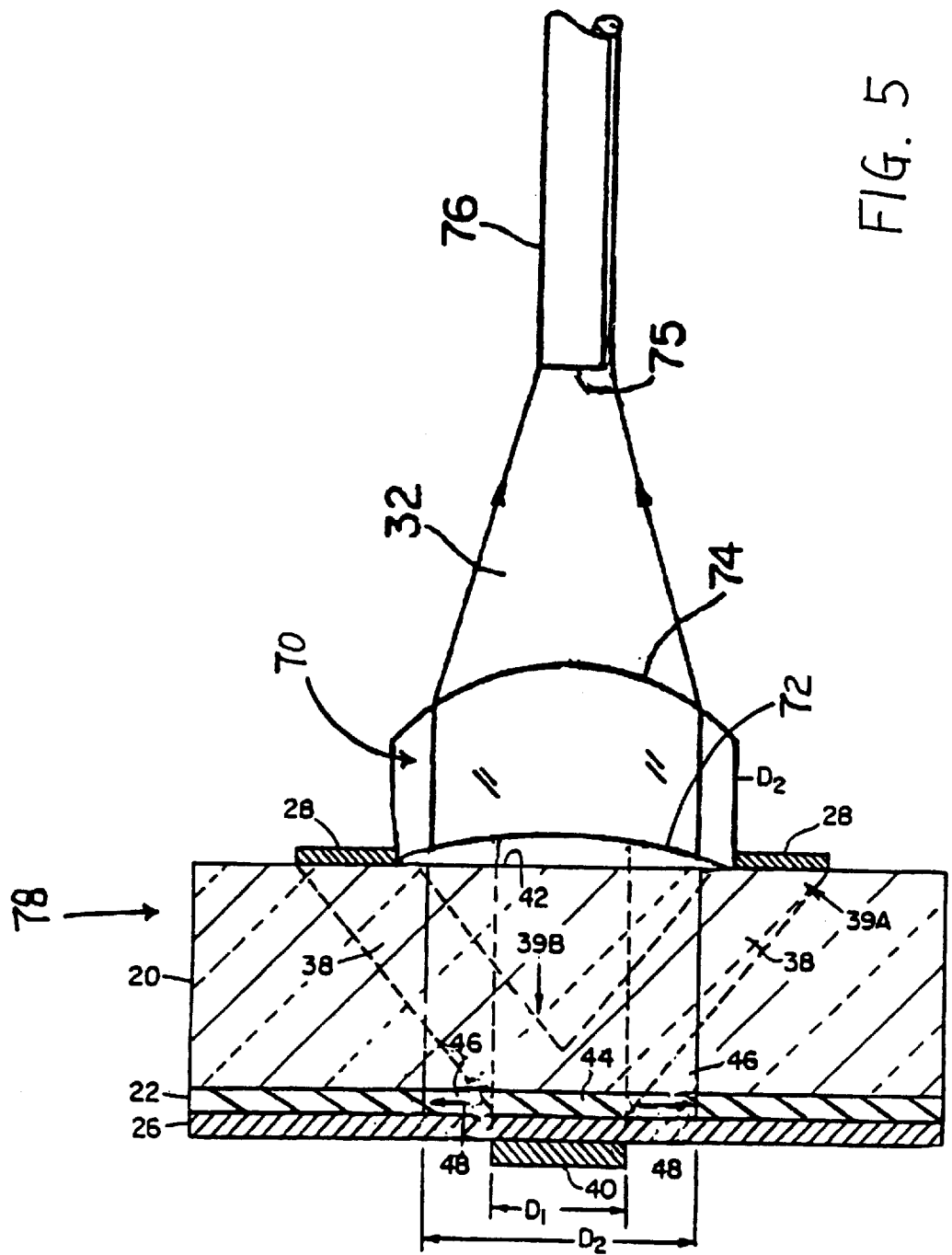
FIG. 5 is a side view of a coupling configuration for coupling output energy into a fiber-optic.

A second alternative embodiment is illustrated in FIG. 5, representative of a side view of an optical coupling configuration. A single mirror/lens element 70 includes a first concave face 72 which operates as a resonator mirror for VCSEL laser 78, and a second convex face 74 which operates as a focusing element for directing laser radiation 32 into fiber-optic 76. Please note that, the VCSEL embodiment shown in FIG. 5 is for illustrative purposes only. Alternative VECSEL embodiments may be used under the same principle of the present invention. The fiber-optic 76 may comprise single-mode or multi-mode fiber, and is positioned at the focus of the laser radiation 32 such that the laser energy is directed substantially within the numerical aperture of the fiber. The reflectivity of the first surface 72 is optimized to maximize output power from the laser device 78, while the second surface 74 and the input surface 75 of fiber optic 76 are antireflection coated at the laser wavelength to minimize reflectivity.

During assembly, the mirror/lens element 70 is aligned and positioned to maximize laser output power coupling, and is fixed using well-known techniques, including bonding, soldering, epoxying and/or laser welding. The fiber is then positioned to accept the focused radiation 32 and is set accordingly by any of the above techniques. This embodiment offers the advantage of a reduction of the number of optical elements required to focus energy into a fiber by incorporating the function of a cavity mirror and an output lens into a single element.

Please noted that there is a design trade-off among thickness, resistance, and optical loss of the semiconductor substrate 20, the gain region 22, and the first and second reflectors 26, 30 of the VECSEL or VCSEL devices for optimum device performance. On the one hand, the doping level of each of these regions should be low enough to minimize the impurity absorption, the intra conduction band absorption and the free carrier absorption and, thus, to prevent excessive optical loss in these regions. If the doping levels in these regions are too high, the optical loss due to the free carrier absorption will lower the optical efficiency of the VECSEL or VCSEL laser devices.

On the other hand, the VECSEL/VCSEL device should have a low series resistance to have better electrical efficiency of the device. There are three major contributions to the series resistance of the VECSEL/VCSEL device, namely, the semiconductor substrate 20, the gain region 22, and the P-type first reflector 26. The resistance of the P-type first reflector 26 could be substantially reduced by use of carbon doping to a concentration of approximately $1 \times 10^{19}$ $cm^{-3}$, or by use of a graded alloy composition in the GaAs/GaAlAs p-type reflector layer 26, to suppress the Schottky barriers at the interface. Furthermore, the resistance of the excited gain region 22 is usually negligible, as compared to that of the semiconductor substrate 20. Therefore, the series resistance of the semiconductor substrate 20 (normally, formed by a GaAs layer doped with n-type impurities having a concentration of between $2 \times 10^{16}$ $cm^{-3}$ and $1 \times 10^{18}$ $cm^{-3}$ and a thickness of between 10 $\mu$m and 200 $\mu$m) would dominate the total series resistance of the VECSEL/VCSEL device, if the resistance of the P-type first reflector 26 is designed to have a negligible resistance. The higher the doping level, the lower the series resistance of the semiconductor substrate 20 will be. Thus, the design trend of the semiconductor substrate 20 moves in the direction of higher doping concentration. The resistance of a semiconductor material is a function of the electron concentration, i.e., the higher the electron concentration, the lower the resistance will be. Furthermore, using computer programs having the finite analysis method, the resistance is found, in general, substantially independent to the thickness of the semiconductor substrate 20. Higher doping concentration will also reduce the thermal dissipation of the VECSEL device, and a thinner substrate layer will reduce the distance to a heat sink (not shown). As a result, the thermal performance and the reliability of the VECSEL/VCSEL device may also be improved.

However, the doping level of the semiconductor substrate 20, as mentioned above, shouldn't be too high as to generate too much of the optical loss. The optimum doping level of the semiconductor substrate is therefore determined by balancing the optical efficiency against the electrical efficiency of the laser device.

Furthermore, the thicker the semiconductor substrate 20, the larger the optical loss due to the free carrier absorption effect will occur, as the stimulated optical emission from the excited gain region 22 will have to travel longer distance in the semiconductor substrate 20 before it could reach the second reflector 30. However, if the semiconductor substrate 20 is too thin, it will be more difficult to handle the semiconductor substrate 20 during manufacturing and that might affect the yield rate of the manufacturing process. Therefore, the semiconductor substrate 20 should be thick enough to be handled conveniently for processing but thin enough to have low intracavity free carrier absorption.

One or both surfaces of the semiconductor substrate 20 may also be optically polished to approximately one wavelength flatness over the wafer diameter, as is well known in the art.

FIG. 6 shows an alternative embodiment of the present invention. In FIG. 6, a reflective element 80 is monolithically positioned on the semiconductor substrate 20. The reflective element 80 functions as a stable resonator for defining the fundamental emission mode of the VCSEL laser device of the present invention. In addition, by having a similar configuration of the element 70 in FIG. 5, the reflective element 80 may also function as a lens element for focusing laser emission to be incorporated into the fiber-optic 76 shown in FIG. 5. In the preferred embodiment, the reflective element 80 is grown directly on the semiconductor substrate 20 by various deposition techniques well known in the art. Prior to forming the reflective element 80, the surface of the semiconductor substrate 20 is configured to a predetermined radius R. The configuration of the substrate surface may be accomplished by various etching techniques well known in the art, e.g., by reactive ion etching, plasma etching or re-growth techniques. After the substrate surface is configured to the predetermined radius R, the reflective element 80 is then monolithically formed on the surface of the semiconductor substrate 20. As a result, the reflective surface of the element 80 has a radius R directly adjacent to the substrate surface to couple the optical emission to the fundamental emission mode. The outer surface of the element 80 may also have the similar radius R, or it may have a convex radius for focusing optical emission purposes. The reflective element 80 may be formed by a n-type Bragg mirror or by a dielectric material, or both.

Alternatively, the reflective element 80 may be bonded to the semiconductor substrate 20 using flip-chip bonding techniques that are well known in the art, as compared to being monolithically grown on the semiconductor substrate 20.

In yet another embodiment, the non-linear crystal 58 may be positioned on the semiconductor substrate 20 between the semiconductor substrate 20 and the reflective element 80 to generate harmonics of the fundamental output laser wavelength. Similarly, the non-linear crystal 58 may be monolithically grown on the semiconductor substrate 20, or it may be bonded to the semiconductor substrate 20 by various techniques.

FIG. 2(c) shows another alternative embodiment of the present invention. In FIG. 2(c), the present invention includes a n-type resistance-spreading region 86 used to reduce current crowding effect commonly affecting most conventional VCSEL/VECSEL laser devices. For any VECSEL/VCSEL laser devices, having an uniform current injection level is critical to improve efficiency of extracting laser power in a fundamental emission mode. In a conventional VECSEL/VCSEL device, when electrical current is directed into the VECSEL/VCSEL device for stimulating optical emission, the current density at the edge of the optical emission aperture (i.e., around the edge of the annular contact 28) of the conventional VECSEL/VCSEL device is often higher than the current density at the center of the aperture. This phenomenon is called current crowding effect, which causes uneven distribution of current injection in the VECSEL/VCSEL device and reduces efficiency of its fundamental emission mode. Although the current crowding effect is substantially minimized by various techniques recently developed, it remains an undesirable problem to most VECSEL/VCSEL devices.

Note that the above-mentioned parameters of the semiconductor GaAs substrate 20, i.e., doped n-type to between $2 \times 10^{16}$ $cm^{-3}$ and $1 \times 10^{18}$ $cm^{-3}$ and having a thickness of between 10 μm and 200 μm, will substantially reduce the current crowding effect, while it still allows efficient extraction of the $TEM_{00}$ mode. Moreover, the present invention offers an unique solution to further reduce the current crowding effect beyond that provided by the substrate parameters mentioned above by providing one or more heavily doped n-type resistance-spreading region(s) 86 to the VCSEL device, as shown in FIG. 2(c). The resistance-spreading region 86 is also applicable to VECSEL devices, although only the VCSEL device is shown in FIG. 2(c) for an illustrative purpose. The resistance-spreading region 86 is positioned at the top of the semiconductor substrate 20 directly adjacent to the annular contact 28. This resistance-spreading region may be composed of a single layer with an n-type concentration of between $5 \times 10^{18}$ $cm^{-3}$ and $2 \times 10^{19}$ $cm^{-3}$, or it could be composed of 10 or more thin layers each having an n-type concentration of approximately $5 \times 10^{18}$ $cm^{-3}$ to $2 \times 10^{19}$ $cm^{-3}$ and 30 nm to 75 nm wide separated by regions doped n-type of approximately $1 \times 10^{17}$ $cm^{-3}$ to $1 \times 10^{18}$ $cm^{-3}$. The resistance-spreading region 86 not only could reduce the current crowding effect, it would also reduce local heating and subsequent reflective index distortion phenomena that commonly associate with the current crowding effect. By providing a resistance-spreading region 86, the present invention thus increases the fundamental mode emission efficiency of the VECSEL/VCSEL devices.

Each of the thin layers of the resistance-spreading region 86 in the VECSEL/VCSEL device should be located approximately at a node of the optical energy emission defined by the wavelength of the laser and the first and second reflectors 26, 30 to minimize the free carrier absorption effect. Thus, the doping density of the semiconductor substrate 20 may be reduced and the thickness of the same may be increased while still maintaining a good efficiency of the fundamental emission mode, if the resistance-spreading region 86 is added to the VECSEL device.

What is claimed is:

1. A laser device, comprising:
   first and second reflectors respectively positioned at opposite ends of a resonant cavity for defining a fundamental cavity mode;
   a semiconductor substrate positioned in the cavity;
   a gain medium positioned on a first surface of said semiconductor substrate, said first reflector being positioned on said gain medium;
   a first contact positioned on said first reflector, said first contact being adapted to define a first volume within said gain medium; and
   a second contact positioned on a second surface, opposite to the first, of said semiconductor substrate, said second reflector being positioned directly adjacent to said second contact, said first and second contacts being adapted to transmit energy for energizing the first volume of said gain medium causing optical energy emission in the first volume, the optical energy emission in the first volume transmitting in both longitudinal and transverse directions to the fundamental cavity mode wherein the optical energy emission in the transverse direction is adapted to optically pump a second volume of said gain medium about the first volume and the optical energy emissions in both first and second volumes are coupled into the fundamental cavity mode by said first and second reflectors.

2. The laser device of claim 1, wherein said first contact has a circular shape and said second contact has an annular ring shape, said second reflector being positioned on said second contact.

3. The laser device of claim 2, said second reflector having a first reflective surface facing said semiconductor substrate and a second transmissive surface opposite to the first surface, wherein the first reflective surface of said second reflector is bonded to said second contact.

4. The laser device of claim 3, wherein said first reflective surface is concave and said second transmissive surface is convex.

5. The laser device of claim 1, wherein said first reflector and said second reflector are monolithically positioned respectively on said gain medium and said semiconductor substrate.

6. The laser device of claim 5, wherein said second reflector has a first reflective surface directly adjacent to said semiconductor substrate and a second transmissive surface, opposite to said first reflective surface.

7. The laser device of claim 6, wherein said first reflective surface is concave and said second transmissive surface is convex.

8. The laser device of claim 1, wherein said first and second contacts are adapted to transmit electrical energy for energizing the first volume of said gain medium to cause optical energy emission in said first volume.

9. The laser device of claim 1, wherein the first volume of said gain medium is optically energized by an external energy source to cause optical energy emission in the first volume.

10. The laser device of claim 1, further comprising a resistance-spreading region positioned on said semiconductor substrate opposite to said gain medium, said resistance-spreading region being heavily doped with n-type dopants.

11. The laser device of claim 10, wherein said resistance-spreading region is positioned at a node of the optical energy emission defined by the length of the resonant cavity and by the wavelength of the optical energy emission.

12. The laser device of claim 11, wherein said resistance-spreading region comprises a single layer heavily doped with n-type dopants having a concentration of approximately $5\times10^{18}$ cm$^{-3}$ to $2\times10^{19}$ cm$^{-3}$.

13. The laser device of claim 11, wherein said resistance-spreading region comprises a plurality of thin layers doped n-type having a concentration of approximately $5\times10^{18}$ cm$^{-3}$ to $2\times10^{19}$ cm$^{-3}$ and separated by regions doped n-type having a concentration of approximately $1\times10^{16}$ cm$^{-3}$ to $1\times10^{17}$ cm$^{-3}$, each said thin layer being positioned approximately at a node of the optical energy emission defined by the length of the resonant cavity and by the wavelength of the optical energy emission.

14. The laser device of claim 13, wherein said resistance-spreading region comprises 10 or more heavily doped thin layers.

15. The laser device of claim 1, wherein said second reflector comprises a dielectric mirror.

16. The laser device of claim 1, wherein said second reflector comprises an n-type Bragg mirror.

17. The laser device of claim 1, wherein said first reflector is doped with carbon having a concentration of approximately $1\times10^{18}$ cm$^{-3}$ to $2\times10^{19}$ cm$^{-3}$.

18. The laser device of claim 1, further comprising a non-linear material positioned between said second reflector and said semiconductor substrate, said non-linear material adjusting frequencies of the optical energy emission in said gain medium.

19. The laser device of claim 18, wherein said non-linear material is bonded to said second contact and said second reflector is bonded to said non-linear material.

20. The laser device of claim 18, wherein said non-linear material is monolithically formed on said semiconductor substrate and said second reflector is bonded to said non-linear material.

21. The laser device of claim 18, wherein said non-linear material is monolithically formed on said semiconductor substrate and said second reflector is monolithically formed on said non-linear material.

22. A vertical cavity surface emitting laser device, comprising:
    first and second reflectors respectively positioned at opposite ends of a resonant cavity for defining a fundamental cavity mode, said second reflector being adapted to focus optical energy emission of the laser device;
    a semiconductor substrate, said second reflector being positioned directly adjacent to said semiconductor substrate;
    a gain medium positioned on said semiconductor substrate, said first reflector being positioned on said gain medium;
    a first contact positioned on said first reflector, said first contact being adapted to define a first volume within said gain medium; and
    a second contact positioned on said semiconductor substrate, said first and second contacts being adapted to transmit energy for energizing the first volume of said gain medium causing optical energy emission in the first volume, the optical energy emission in the first volume transmitting in both longitudinal and transverse directions to the fundamental cavity mode wherein the optical energy emission in the transverse direction is adapted to optically pump a second volume of said gain medium about the first volume and the optical energy emissions in both first and second volumes are coupled into the fundamental cavity mode by said first and second reflectors.

23. The vertical cavity surface emitting laser device of claim 22, wherein said second reflector is monolithically formed on said semiconductor substrate.

24. The vertical cavity surface emitting laser device of claim 23, wherein said second reflector is formed on a configured surface of said semiconductor substrate, said second reflector having a concave reflective surface positioned directly adjacent to said semiconductor substrate and a convex transmissive surface opposite to said concave surface.

25. The vertical cavity surface emitting laser device of claim 22, wherein said second reflector is bonded to said semiconductor substrate.

26. The vertical cavity surface emitting laser device of claim 25, wherein said second reflector is bonded to a configured surface of said semiconductor substrate, said second reflector having a concave reflective surface positioned directly adjacent to said semiconductor substrate and a convex transmissive surface opposite to said concave surface.

27. A vertical cavity surface emitting laser device, comprising:
    first and second reflectors respectively positioned at opposite ends of a resonant cavity for defining a fundamental cavity mode, said second reflector being adapted to focus optical energy emission of the laser device;
    a semiconductor substrate;
    a nonlinear material, said nonlinear material being positioned directly adjacent to and between said second reflector and said semiconductor substrate;
    a gain medium positioned on said semiconductor substrate, said first reflector being positioned on said gain medium;
    a first contact positioned on said first reflector, said first contact being adapted to define a first volume within said gain medium; and
    a second contact positioned on said semiconductor substrate, said first and second contacts being adapted to transmit energy for energizing the first volume of said gain medium causing optical energy emission in the first volume, the optical energy emission in the first volume transmitting in both longitudinal and transverse directions to the fundamental cavity mode wherein the optical energy emission in the transverse direction is adapted to optically pump a second volume of said gain medium about the first volume and the optical energy emissions in both first and second volumes are coupled into the fundamental cavity mode by said first and second reflectors.

* * * * *